United States Patent
Iwasawa (10) Patent No.: US 11,127,569 B2
(45) Date of Patent: Sep. 21, 2021

(54) PLASMA-RESISTANT MEMBER

(71) Applicant: TOTO LTD., Kitakyushu (JP)

(72) Inventor: Junichi Iwasawa, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 578 days.

(21) Appl. No.: 16/015,832

(22) Filed: Jun. 22, 2018

(65) Prior Publication Data

US 2018/0301321 A1    Oct. 18, 2018

Related U.S. Application Data

(63) Continuation of application No. PCT/JP2015/086337, filed on Dec. 25, 2015.

(30) Foreign Application Priority Data

Dec. 24, 2015 (JP) .............................. JP2015-251873

(51) Int. Cl.
   *C23C 16/505* (2006.01)
   *C23C 4/10* (2016.01)
   (Continued)

(52) U.S. Cl.
   CPC ...... *H01J 37/32495* (2013.01); *C01F 17/218* (2020.01); *C23C 4/11* (2016.01);
   (Continued)

(58) Field of Classification Search
   CPC ........... H01J 37/32495; H01J 37/32715; C01F 17/206; C01F 17/218; C23C 24/04;
   (Continued)

(56) References Cited

U.S. PATENT DOCUMENTS

2009/0233126 A1\* 9/2009 Iwasawa ................ C23C 24/04
                                                                          428/702
2014/0360407 A1   12/2014 Kitamura et al.
(Continued)

FOREIGN PATENT DOCUMENTS

CN          103449816 A      12/2013
JP          2006-089338 A     4/2006
(Continued)

*Primary Examiner* — Daniel J. Schleis
*Assistant Examiner* — Kevin C T Li
(74) *Attorney, Agent, or Firm* — Carrier Blackman & Associates, P.C.; William D. Blackman; Joseph P. Carrier (57) ABSTRACT

A plasma-resistant member that includes a base material and a layer structural component is provided, wherein the layer structural component includes an yttria polycrystalline body, is formed at a surface of the base material, and has plasma resistance; crystallites that are included in the yttria polycrystalline body included in the layer structural component are not bonded to each other via a heterogenous phase; the yttria polycrystalline body included in the layer structural component has a crystal structure including only cubic, or a crystal structure in which cubic and monoclinic coexist; and an average value of a proportion of monoclinic to cubic inside the yttria polycrystalline body included in the layer structural component is greater than 0% and not more than 60%.

9 Claims, 4 Drawing Sheets

(51) Int. Cl.
  *C23C 24/04* (2006.01)
  *H01L 21/3065* (2006.01)
  *H01L 21/31* (2006.01)
  *H01J 37/32* (2006.01)
  *C23C 4/11* (2016.01)
  *C23C 16/44* (2006.01)
  *C23C 16/50* (2006.01)
  *C01F 17/218* (2020.01)
  *H01L 21/67* (2006.01)
  *H01L 21/683* (2006.01)

(52) U.S. Cl.
  CPC .......... *C23C 16/4404* (2013.01); *C23C 16/50* (2013.01); *C23C 24/04* (2013.01); *C01P 2002/60* (2013.01); *C01P 2002/76* (2013.01); *C01P 2004/02* (2013.01); *H01J 37/32715* (2013.01); *H01L 21/67017* (2013.01); *H01L 21/6831* (2013.01)

(58) Field of Classification Search
  CPC ....... C23C 4/11; C23C 16/4404; C23C 16/50; C01P 2004/02; C01P 2002/60; C01P 2002/76; H01L 21/6831; H01L 21/02595; H01L 21/02609; H01L 21/3065; H01L 21/31; H01L 21/763
  See application file for complete search history.

(56) References Cited

U.S. PATENT DOCUMENTS

| | | | |
|---|---|---|---|
| 2015/0152540 A1 | 6/2015 | Sato et al. | |
| 2017/0152189 A1* | 6/2017 | Iwasawa | C04B 41/5045 |

FOREIGN PATENT DOCUMENTS

| | | | |
|---|---|---|---|
| JP | 2007-131943 A | 5/2007 | |
| JP | 2016-027624 A | 2/2016 | |
| KR | 101094725 B1 | 12/2011 | |
| WO | 2013/099890 A1 | 7/2013 | |
| WO | 2013/176168 A1 | 11/2013 | |
| WO | WO-2013176168 A1 * | 11/2013 | ............. C23C 24/04 |

* cited by examiner

| HEATING | PROPORTION OF MONOCLINIC (M) TO CUBIC (C) (M/C)×100 (%) | | CRYSTALLITE SIZE (nm) | | LATTICE STRAIN (%) | | OXYGEN (O) /YTTRIUM (Y) ATOMIC CONCENTRATION RATIO X | FLUCTUATION OF SURFACE ROUGHNESS AFTER CHEMICAL CLEANING |
|---|---|---|---|---|---|---|---|---|
| | AVERAGE VALUE x | STANDARD DEVIATION s | AVERAGE VALUE x | STANDARD DEVIATION s | AVERAGE VALUE x | STANDARD DEVIATION s | | |
| NONE | 70 | 22 | 11 | 1.6 | 0.6 | 0.05 | $1.9 \leq x \leq 2.2$ | LARGE |
| 200°C | 60 | 15 | 12 | 1.1 | 0.5 | 0.04 | $1.5 \leq x \leq 1.8$ | MEDIUM |
| 300°C | 25 | 6 | 17 | 0.6 | 0.4 | 0.01 | $1.5 \leq x \leq 1.8$ | MEDIUM |
| 350°C | 17 | 4 | 20 | 0.5 | 0.4 | 0.01 | $1.5 \leq x \leq 1.8$ | MEDIUM |
| 400°C | 2 | 1 | 22 | 0.2 | 0.3 | 0.005 | $1.4 \leq x \leq 1.7$ | SMALL |
| 600°C | 0.5 | 0 | 40 | 0.1 | 0.2 | 0.003 | $1.3 \leq x \leq 1.6$ | SMALL |

PLASMA-RESISTANT MEMBER

CROSS-REFERENCE TO RELATED APPLICATIONS

This is a continuation application of International Application PCT/JP2015/086337, filed on Dec. 25, 2015. This application also claims priority to Japanese Application No. 2015-251873, filed on Dec. 24, 2015; the entire contents of each are incorporated herein by reference.

FIELD OF THE INVENTION

Embodiments described herein relate generally to a plasma-resistant member, and specifically to a plasma resistant member for a semiconductor manufacturing apparatus for performing processing such as dry etching, ashing, sputtering, and CVD in a chamber.

BACKGROUND OF THE INVENTION

In the manufacturing processes of a semiconductor, the stability of the yield and the increase of the yield due to reducing discrepancies of the device to be manufactured are desirable.

Conversely, there is a manufacturing apparatus of an electronic device in which the ceiling of the chamber includes quartz glass; and the average surface roughness of a micro uneven portion formed in the inner surface of the ceiling is 0.2 to 5 μm (Japanese Patent No. 251215). Also, there is a plasma-resistant member, in which pores and grain boundary layers do not exist, that suppresses/reduces the occurrence of particle detachment from the plasma-resistant member (Japanese Patent No. 864958).

To increase the yield by reducing the discrepancies of the device to be manufactured in the manufacturing processes of the semiconductor, the occurrence of particles is reduced by coating an yttria film having excellent plasma resistance on the interior wall of the chamber. Further, recently, pattern downscaling of the semiconductor device is advancing; and stable control of nanolevel particles is desirable.

SUMMARY OF THE INVENTION

According to an embodiment of the invention, a plasma-resistant member that includes a base material and a layer structural component is provided, wherein the layer structural component The yttria polycrystalline body included in the layer structural component has either a crystal structure including only cubic, or a crystal structure in which cubic and monoclinic coexist; and an average value of a proportion of monoclinic to cubic inside the yttria polycrystalline body included in the layer structural component is greater than 0% and not more than 60% In this embodiment, an average crystallite size of the yttria polycrystalline body included in the layer structural component is not less than 12 nanometers and not more than 40 nanometers.

DETAILED DESCRIPTION

A first invention is a plasma-resistant member including a base material and a layer structural component, wherein the layer structural component includes an yttria polycrystalline body, is formed at a surface of the base material, and has plasma resistance; crystallites that are included in the yttria polycrystalline body included in the layer structural component are not bonded to each other via a heterogenous phase; the yttria polycrystalline body included in the layer structural component has a crystal structure including only cubic, or a crystal structure in which cubic and monoclinic coexist; and an average value of a proportion of monoclinic to cubic inside the yttria polycrystalline body included in the layer structural component is greater than 0% and not more than 60%.

According to the plasma-resistant member, the layer structural component has a dense structure compared to that of an yttria sintered body, an yttria thermal-sprayed film, etc. Thereby, the plasma resistance of the plasma-resistant member is higher than the plasma resistance of the sintered body, the thermal-sprayed film, etc. Also, the probability of the plasma-resistant member being a production source of particles is lower than the probability of the sintered body, the thermal-sprayed film, etc., being production sources of particles. Thereby, the plasma resistance of the plasma-resistant member can be maintained; and the particles can be reduced. Also, by setting the average value of the proportion of monoclinic to cubic inside the layer structural component to be 60% or less, the chemical resistance of the layer structural component can be maintained after the chemical cleaning during maintenance. By maintaining the chemical resistance of the plasma-resistant member mounted inside the chamber, the state of the plasma generated inside the chamber can be stabilized because the surface state does not change due to erosion. Thereby, the particles produced in the manufacturing processes of the semiconductor can be reduced; and the chamber conditions can be maintained stably.

A second invention is the plasma-resistant member of the first invention, wherein a standard deviation of a distribution of the proportion of monoclinic to cubic in the yttria polycrystalline body included in the layer structural component is not less than 0% and not more than 15%.

According to the plasma-resistant member, the yttria polycrystalline body that is included in the layer structural component has low fluctuation and a dense crystal structure. Thereby, the chemical resistance of the layer structural component in the chemical cleaning during maintenance can be improved further.

A third invention is a plasma-resistant member including a base material and a layer structural component, wherein the layer structural component includes an yttria polycrystalline body, is formed at a surface of the base material, and has plasma resistance; crystallites that are included in the yttria polycrystalline body included in the layer structural component are not bonded to each other via a heterogenous phase; the yttria polycrystalline body that is included in the layer structural component has a crystal structure including only cubic, or a crystal structure in which cubic and monoclinic coexist; and an average value of a proportion of monoclinic to cubic inside the yttria polycrystalline body included in the layer structural component is 25% or less.

According to the plasma-resistant member, the layer structural component has a dense structure compared to that of an yttria sintered body, an yttria thermal-sprayed film, etc. Thereby, the plasma resistance of the plasma-resistant member is higher than the plasma resistance of the sintered body, the thermal-sprayed film, etc. Also, the probability of the plasma-resistant member being a production source of particles is lower than the probability of the sintered body, the thermal-sprayed film, etc., being production sources of particles. Thereby, the plasma resistance of the plasma-resistant member can be maintained; and the particles can be reduced. Also, by setting the average value of the proportion of monoclinic to cubic inside the layer structural component to be 25% or less, the chemical resistance of the layer structural component after the chemical cleaning during maintenance can be maintained. By maintaining the chemical resistance of the plasma-resistant member mounted inside the chamber, the state of the plasma generated inside the chamber can be stabilized because the surface state does not change due to erosion. Thereby, the particles produced in the manufacturing processes of the semiconductor can be reduced; and the chamber conditions can be maintained stably.

A fourth invention is the plasma-resistant member of the first invention, wherein the average crystallite size of the yttria polycrystalline body included in the layer structural component is not less than 12 nanometers and not more than 40 nanometers.

According to the plasma-resistant member, the average crystallite size of the yttria polycrystalline body is extremely small. Because the layer structural component includes such a dense yttria polycrystalline body, the particles that are produced inside the chamber in the manufacturing processes of the semiconductor can be reduced further.

A fifth invention is the plasma-resistant member of the fourth invention, wherein a standard deviation of a distribution of a crystallite size of the yttria polycrystalline body included in the layer structural component is not less than 0.1 nanometers and not more than 1.1 nanometers.

According to the plasma-resistant member, the average crystallite size of the yttria polycrystalline body and the standard deviation of the distribution of the crystallite size of the yttria polycrystalline body each are extremely small. Because the layer structural component includes such a dense yttria polycrystalline body, the particles that are produced inside the chamber in the manufacturing processes of the semiconductor can be reduced further.

A sixth invention is the plasma-resistant member of the first invention, wherein an average lattice strain of the yttria polycrystalline body included in the layer structural component is not less than 0.2% and not more than 0.5%.

According to the plasma-resistant member, the average lattice strain of the yttria polycrystalline body is extremely small. Thereby, the chemical resistance of the layer structural component after the chemical cleaning during maintenance can be maintained while maintaining the crystallite size of the yttria polycrystalline body included in the layer structural component to be a fine size. Thereby, the particles produced in the manufacturing processes of the semiconductor can be reduced; and the chamber conditions can be maintained stably.

A seventh invention is the plasma-resistant member of the sixth invention, wherein a standard deviation of a distribution of the lattice strain of the yttria polycrystalline body included in the layer structural component is not less than 0.003% and not more than 0.04%.

According to the plasma-resistant member, the average lattice strain of the yttria polycrystalline body and the standard deviation of the distribution of the lattice strain of the yttria polycrystalline body each are extremely small. Thereby, the chemical resistance of the layer structural component after the chemical cleaning during maintenance can be maintained while maintaining the crystallite size of the yttria polycrystalline body included in the layer structural component to be a fine size. Thereby, the particles produced in the manufacturing processes of the semiconductor can be reduced; and the chamber conditions can be maintained stably.

An eighth invention is the plasma-resistant member of the first invention, wherein a ratio (O/Y) of an atomic concentration of oxygen (O) to an atomic concentration of yttrium (Y) inside the yttria polycrystalline body included in the layer structural component is not less than 1.3 and not more than 1.8.

According to the plasma-resistant member, the particles can be reduced because the bond between the yttria grains is stronger. Also, because of the denser structure, the chemical resistance of the layer structural component can be maintained because the penetration of a chemical into the layer structural component interior after the chemical cleaning during maintenance can be suppressed. Thereby, the particles produced in the manufacturing processes of the semiconductor can be reduced; and the chamber conditions can be maintained stably.

A ninth invention is the plasma-resistant member of the third invention, wherein the average crystallite size of the yttria polycrystalline body included in the layer structural component is not less than 12 nanometers and not more than 40 nanometers.

According to the plasma-resistant member, the average crystallite size of the yttria polycrystalline body is extremely small. Because the layer structural component includes such a dense yttria polycrystalline body, the particles that are produced inside the chamber in the manufacturing processes of the semiconductor can be reduced further.

A tenth invention is the plasma-resistant member of the ninth invention, wherein a standard deviation of a distribution of a crystallite size of the yttria polycrystalline body included in the layer structural component is not less than 0.1 nanometers and not more than 1.1 nanometers.

According to the plasma-resistant member, the average crystallite size of the yttria polycrystalline body and the standard deviation of the distribution of the crystallite size of the yttria polycrystalline body each are extremely small. Because the layer structural component includes such a dense yttria polycrystalline body, the particles that are produced inside the chamber in the manufacturing processes of the semiconductor can be reduced further.

An eleventh invention is the plasma-resistant member of the third invention, wherein an average lattice strain of the yttria polycrystalline body included in the layer structural component is not less than 0.2% and not more than 0.5%.

According to the plasma-resistant member, the average lattice strain of the yttria polycrystalline body is extremely small. Thereby, the chemical resistance of the layer structural component after the chemical cleaning during maintenance can be maintained while maintaining the crystallite size of the yttria polycrystalline body included in the layer structural component to be a fine size. Thereby, the particles produced in the manufacturing processes of the semiconductor can be reduced; and the chamber conditions can be maintained stably.

A twelfth invention is the plasma-resistant member of the eleventh invention, wherein a standard deviation of a distribution of the lattice strain of the yttria polycrystalline body included in the layer structural component is not less than 0.003% and not more than 0.04%.

According to the plasma-resistant member, the average lattice strain of the yttria polycrystalline body and the standard deviation of the distribution of the lattice strain of the yttria polycrystalline body each are extremely small. Thereby, the chemical resistance of the layer structural component after the chemical cleaning during maintenance can be maintained while maintaining the crystallite size of the yttria polycrystalline body included in the layer structural component to be a fine size. Thereby, the particles produced in the manufacturing processes of the semiconductor can be reduced; and the chamber conditions can be maintained stably.

An thirteenth invention is the plasma-resistant member of the third invention, wherein a ratio (O/Y) of an atomic concentration of oxygen (O) to an atomic concentration of yttrium (Y) inside the yttria polycrystalline body included in the layer structural component is not less than 1.3 and not more than 1.8.

According to the plasma-resistant member, the particles can be reduced because the bond between the yttria grains is stronger. Also, because of the denser structure, the chemical resistance of the layer structural component can be maintained because the penetration of a chemical into the layer structural component interior after the chemical cleaning during maintenance can be suppressed. Thereby, the particles produced in the manufacturing processes of the semiconductor can be reduced; and the chamber conditions can be maintained stably.

Embodiments of the invention will now be described with reference to the drawings. Similar components in the drawings are marked with the same reference numerals; and a detailed description is omitted as appropriate.

Figure 1:
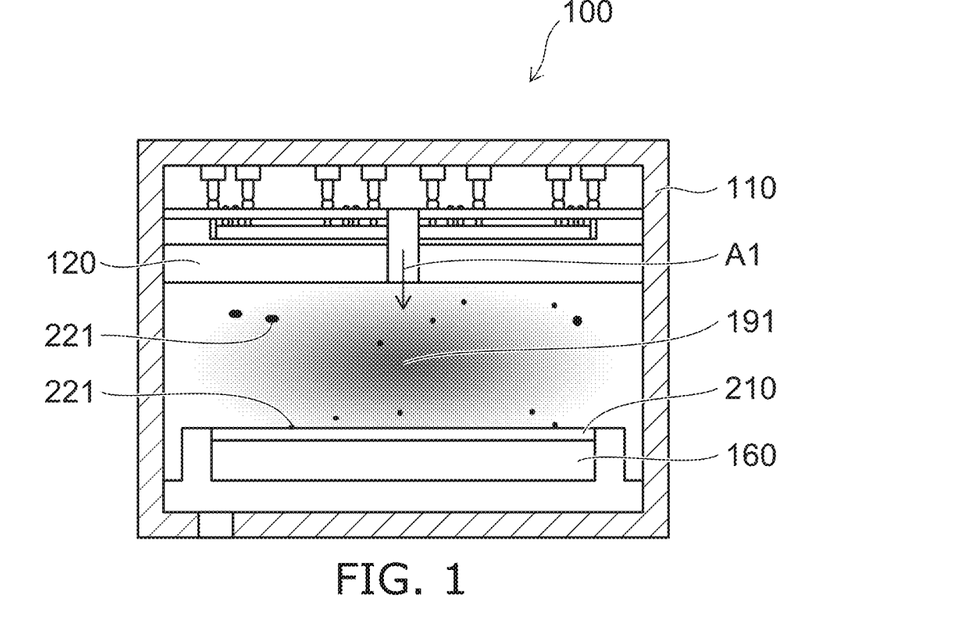
FIG. 1 is a schematic cross-sectional view illustrating a semiconductor manufacturing apparatus including a plasma-resistant member according to an embodiment of the invention.

FIG. 1 is a schematic cross-sectional view illustrating a semiconductor manufacturing apparatus including a plasma-resistant member according to an embodiment of the invention.

The semiconductor manufacturing apparatus 100 illustrated in FIG. 1 includes a chamber 110, a plasma-resistant member 120, and an electrostatic chuck 160. The plasma-resistant member 120 is called, for example, the top plate, etc., and is provided at the upper portion in the interior of the chamber 110. The electrostatic chuck 160 is provided at the lower portion in the interior of the chamber 110. That is, the plasma-resistant member 120 is provided above the electrostatic chuck 160 in the interior of the chamber 110. An object to be held such as a wafer 210 or the like is placed on the electrostatic chuck 160.

For example, the plasma-resistant member 120 has a structure in which a layer structural component 123 that includes an yttria ($Y_2O_3$) polycrystalline body is formed at the surface of a base material that includes alumina ($Al_2O_3$). The layer structural component 123 of the yttria polycrystalline body is formed by "aerosol deposition." The material of the base material is not limited to a ceramic such as alumina, etc., and may be quartz, alumite, a metal, glass, etc.

"Aerosol deposition" is a method for forcing an "aerosol" including fine particles including a brittle material dispersed in a gas from a nozzle toward a base material such as a metal, glass, ceramic, plastic, etc., causing the fine particles to collide with the base material, causing the brittle material fine particles to deform and fragment due to the impact of the collisions, and causing the brittle material fine particles to bond to directly form the layer structural component (also called the film structural component) 123 made of the constituent material of the fine particles on the base material. According to this method, a heating unit, a cooling unit, or the like is not particularly necessary; it is possible to form the layer structural component 123 at room temperature; and the layer structural component 123 that has a mechanical strength equal to or greater than that of a sintered body can be obtained. Also, it is possible to diversely change the density, the mechanical strength, the electrical characteristics, etc., of the layer structural component 123 by controlling the configuration and composition of the fine particles, the conditions causing the fine particles to collide, etc.

In this specification, "polycrystal" refers to a structure body in which crystal particles are bonded/integrated. A crystal substantially includes one crystal particle. Normally, the diameter of the crystal particle is 5 nanometers (nm) or more. However, the crystal particles are a polycrystal in the case where fine particles are incorporated into the structural component without fragmenting.

Also, in this specification, in the case where the primary particle is a dense particle, "fine particle" refers to an average particle size of 5 micrometers (pm) or less when identified by a particle size distribution measurement, a scanning electron microscope, etc. In the case where the primary particle is a porous particle easily fragmented by impacting, "fine particle" refers to an average particle size of 50 μm or less.

Also, in this specification, "aerosol" refers to a solid-gas mixed phase substance in which the fine particles described above are dispersed in a gas such as helium, nitrogen, argon, oxygen, dry air, a gas mixture including such elements, etc.; and although there are also cases where an "agglomerate" is partially included, "aerosol" refers to the state in which the fine particles are dispersed substantially solitarily. Although the gas pressure and temperature of the aerosol are arbitrary, for the formation of the layer structural component 123, it is desirable for the concentration of the fine particles inside the gas at the timing when forced from the dispensing aperture to be within the range of 0.0003 mL/L to 5 mL/L when the gas pressure is converted to 1 atmosphere and the temperature is converted to 20 degrees Celsius.

One feature of the process of aerosol deposition is that the process normally is performed at room temperature, and the formation of the layer structural component 123 is possible at a temperature that is sufficiently lower than the melting point of the fine particle material, that is, several 100 degrees Celsius or less.

In this specification, "room temperature" refers to a temperature that is markedly lower than the sintering temperature of a ceramic and refers to a room temperature environment of substantially 0 to 100° C.

For the fine particles that are included in the powder body used as the source material of the layer structural component 123, a brittle material such as a ceramic, a semiconductor, etc., can be used as a major body, and fine particles of the same material can be used solitarily or fine particles having different particle sizes can be mixed; and it is possible to mix, combine, and use different types of brittle material fine particles. Also, it is also possible to use fine particles of a metal material, an organic material, etc., by mixing the fine particles of the metal material, the organic material, etc., with the brittle material fine particles and coating the fine particles of the metal material, the organic material, etc., onto the surfaces of the brittle material fine particles. Even in such cases, the brittle material is the major part of the formation of the layer structural component 123.

In this specification, "powder body" refers to the state in which the fine particles described above are naturally coalesced.

For the hybrid structural component formed by such methods, in the case where crystalline brittle material fine particles are used as the source material, the portion of the layer structural component 123 of the hybrid structural component is a polycrystalline body having a small crystal grain size compared to the source material fine particles; and there are many cases where the crystals of the polycrystalline body have substantially no crystal orientation. Also, a grain boundary layer that is made of a glass layer substantially does not exist at the interface between the brittle material crystals. Also, in many cases, the layer structural component 123 portion of the hybrid structural component forms an "anchor layer" that sticks into the surface of the base material. The layer structural component 123, in which the anchor layer is formed, is formed and adhered securely to the base material with exceedingly high strength.

For aerosol deposition, it can be confirmed that fragmentation/deformation occurs for the brittle material fine particles flying onto the base material by using X-ray analysis, etc., to measure the size of the brittle material fine particles used as the source material and the crystallite (crystal grain) size of the brittle material structural component that is formed. In other words, the crystallite size of the layer structural component 123 formed by aerosol deposition is smaller than the crystallite size of the source material fine particles. "New major surfaces" are formed at the "shift surfaces" and/or the "fracture surfaces" formed by the fine particles fragmenting and/or deforming; and the "new major surfaces" are in the state in which atoms that existed in the interior of the fine particle and were bonded to other atoms are exposed. It is considered that the layer structural component 123 is formed by the new major surfaces, which are active and have high surface energy, being bonded to the surfaces of adjacent brittle material fine particles, bonded to new major surfaces of adjacent brittle materials, or bonded to the surface of the base material.

For example, a heterogenous phase occurs between the crystallites of an yttria sintered body or an yttria thermal-sprayed film formed at a high temperature. On the other hand, the layer structural component 123 of aerosol deposition is formed by the bonding of new major surfaces as described above. Thereby, the crystallites that are included in the yttria polycrystalline body formed by aerosol deposition are not bonded to each other via a heterogenous phase. Here, "heterogenous phase" refers to a phase made from an element other than the yttrium and the oxygen included in the yttria polycrystalline body and is a phase formed at the surface of the crystallite of the yttria polycrystalline body. For example, it can be confirmed that the crystallites of the yttria polycrystalline body are not bonded via a heterogenous phase by observing the cross section of the layer structural component 123 by using a transmission electron microscope (Transmission Electron Microscope: TEM).

In the semiconductor manufacturing apparatus 100, high frequency power is supplied; and, for example, a source gas of a halogen-based gas or the like is introduced to the interior of the chamber 110 as illustrated by arrow A1 illustrated in FIG. 1.

The source gas that is introduced to the interior of the chamber 110 is plasmatized in a region 191 between the electrostatic chuck 160 and the plasma-resistant member 120.

The plasma-resistant member 120 is one of the important members for generating high density plasma. Here, if particles 221 produced in the interior of the chamber 110 adhere to the wafer 210, there are cases where discrepancies may occur in the semiconductor device that is manufactured. Then, there are cases where the yield and productivity of the semiconductor device may decrease. Therefore, plasma resistance is necessary for the plasma-resistant member 120.

The plasma-resistant member 120 of the embodiment has a structure in which the layer structural component 123 including the yttria polycrystalline body is formed by aerosol deposition at the surface of the base material including alumina. The layer structural component 123 of the yttria polycrystalline body formed by aerosol deposition has a dense structure compared to an yttria sintered body, an yttria thermal-sprayed film, etc. Thereby, the plasma resistance of the plasma-resistant member 120 of the embodiment is higher than the plasma resistances of the sintered body, the thermal-sprayed film, etc. Also, the probability of the plasma-resistant member 120 of the embodiment being a production source of particles is lower than the probability of the sintered body, the thermal-sprayed film, etc., being production sources of particles. Also, fine particles that function as film-formation-assist particles may be used to densify the layer structural component 123 including the yttria polycrystalline body. Here, the film-formation-assist particles are for making the new major surfaces by deforming or fragmenting the yttria fine particles, are reflected after the collisions, and except for those that are mixed unavoidably, do not directly become the constituent material of the layer structural component.

The layer structural component 123 according to the embodiment refers to a dense layer structural component having a density of 70% or more, favorably 90% or more, and more favorably 99% or more.

Here, the density (%) is calculated from the formula of (bulk specific gravity÷true specific gravity)×100 (%) using the true specific gravity from a reference document value or the theoretical calculated value and the bulk specific gravity determined from the mass and volume of the layer structural component 123. Also, in the case where it is difficult to measure the weight or the volume of the layer structural component 123, for example, the density may be calculated by performing cross section observation using a scanning electron microscope (Scanning Electron Microscope: SEM), etc., and determining the volume of the porous portions inside the layer structural component from three-dimensional image analysis.

Figure 2:
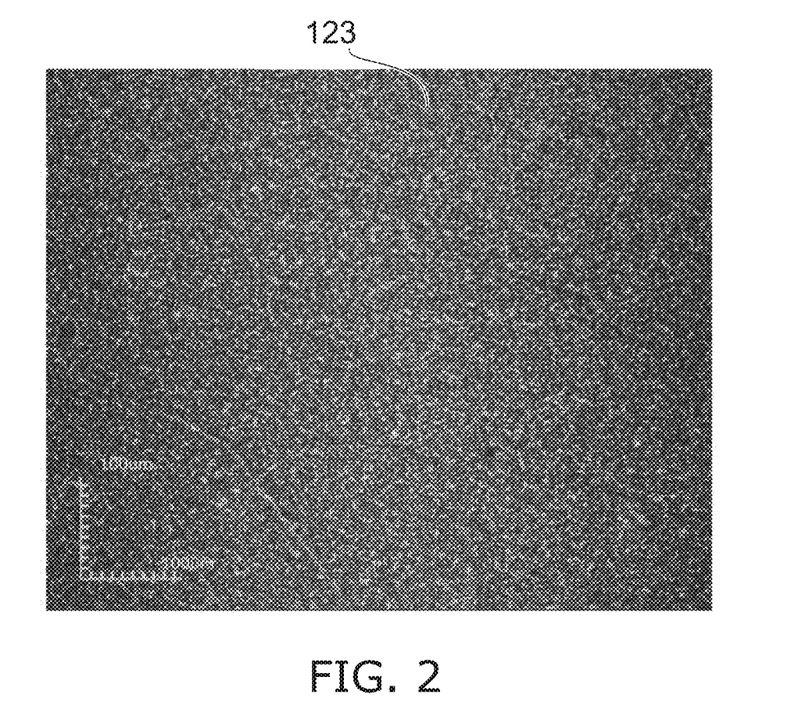
FIG. 2 is a photograph illustrating a surface of the layer structural component formed at a surface of the plasma-resistant member.

Further, the plasma-resistant member 120 of the embodiment has a surface that is surface-roughened as shown in FIG. 2. Thereby, the inventor obtained the knowledge that the particles can be reduced while maintaining the plasma resistance of the plasma-resistant member 120.

The layer structural component 123 that is formed at the surface of the plasma-resistant member 120 of the embodiment will now be described with reference to the drawings.

The inventor performed heating of the layer structural component formed at the surface of the plasma-resistant member 120, and subsequently surface-roughened the surface of the layer structural component 123 by performing chemical processing. The layer structural component on which the heating is performed has a dense structure.

In this specification, "heating" refers to the heating of an object using a dryer, an oven, a firing furnace, a laser, an electron beam, an ion beam, a molecular beam, an atomic beam, a high frequency wave, plasma, etc.

Also, in this specification, "chemical processing" refers to processing of the surface of the object using a substance that produces hydrogen ions in an aqueous solution. For example, as the chemical processing, surface treatment using an aqueous solution including at least one of hydrobromic acid, hydroiodic acid, hypochlorous acid, chlorous acid, chloric acid, perchloric acid, sulfuric acid, fluorosulfonic acid, nitric acid, hydrochloric acid, phosphoric acid, fluoroantimonic acid, tetrafluoroboric acid, hexafluorophosphoric acid, chromic acid, boric acid, methanesulfonic acid, ethanesulfonic acid, benzenesulfonic acid, p-toluenesulfonic acid, trifluoromethanesulfonic acid, polystyrenesulfonic acid, acetic acid, citric acid, formic acid, gluconic acid, lactic acid, oxalic acid, tartaric acid, hydrofluoric acid, carbonic acid, or hydrogen sulfide may be used.

Or, in this specification, "chemical processing" refers to processing of the surface of the object using a substance that produces hydroxide ions in an aqueous solution. For example, as the chemical processing, surface treatment using an aqueous solution including at least one of sodium hydroxide, potassium hydroxide, ammonia, calcium hydroxide, barium hydroxide, copper hydroxide, aluminum hydroxide, or iron hydroxide may be used.

Also, the inventor observed the surface of the layer structural component 123 on which the chemical processing was performed after performing the heating. The photograph is as shown in FIG. 2.

The invention is not limited to the case where the surface of the layer structural component 123 is surface-roughened, and is applicable even as-deposited directly after the film formation, and even in the case where polishing is performed after the film formation.

Figure 3:
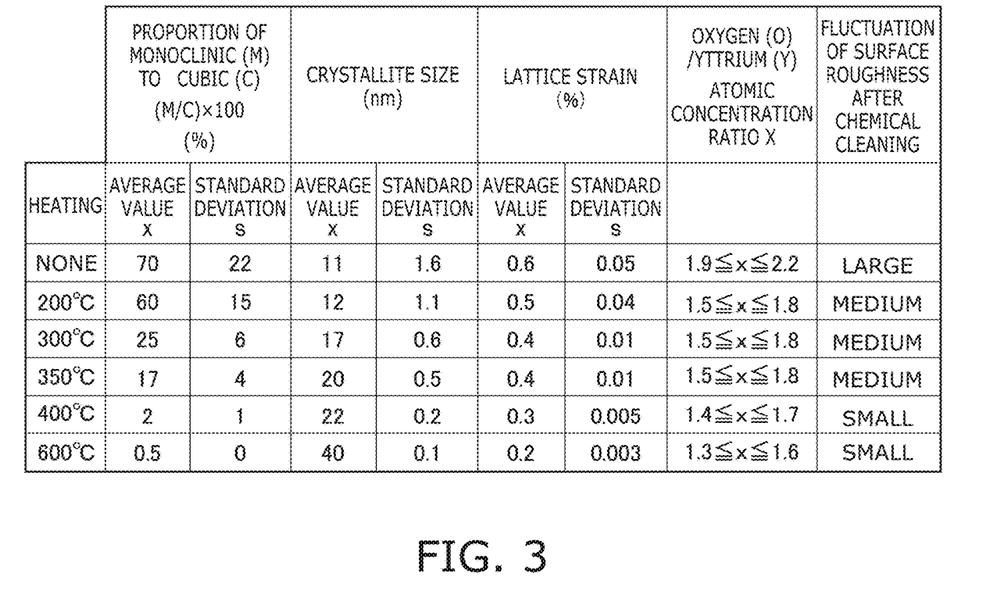
FIG. 3 is a table showing the relationship between the structure and the chemical resistance of the layer structural component formed at the surface of the plasma-resistant member.

FIG. 3 is a table showing the relationship between the heating temperature of the layer structural component, the structure of the layer structural component, and the chemical resistance.

The inventor of the application performed the evaluation of the crystal structure and the chemical resistance for the layer structural component 123 for which the heating is performed after being formed by aerosol deposition. In FIG. 3, 200° C., 300° C., 350° C., 400° C., and 600° C. are shown as an example of the conditions of the heating. The heating time is, for example, about 2 hours.

Also, as a comparative example, the evaluation of the crystal structure and the chemical resistance was performed similarly for a layer structural component for which the heating is not performed after being formed by aerosol deposition.

As the evaluation of the structure of the layer structural component 123, the proportion (M/C) of monoclinic (M) to cubic (C)×100 (%), the crystallite size (nm), the lattice strain (%), and the atomic concentration ratio of oxygen (O) to yttrium (Y) were evaluated.

As the evaluation of the chemical resistance, the size of the fluctuation of the surface roughness of the layer structural component 123 after the chemical cleaning of the layer structural component 123 was classified as "large," "medium," or "small."

Multiple measurement points were measured for each condition of the heat treatment and each evaluation criterion. FIG. 3 shows the average value and the standard deviation for each evaluation criterion of the yttria polycrystalline body inside the layer structural component 123.

Details of the evaluation method described above are described below.

In this specification, "chemical cleaning" refers to chemically cleaning the plasma-resistant member using a substance that produces hydrogen ions in an aqueous solution. For example, chemical cleaning using an aqueous solution including at least one of hydrobromic acid, hydroiodic acid, hypochlorous acid, chlorous acid, chloric acid, perchloric acid, sulfuric acid, fluorosulfonic acid, nitric acid, hydrochloric acid, phosphoric acid, fluoroantimonic acid, tetrafluoroboric acid, hexafluorophosphoric acid, chromic acid, boric acid, methanesulfonic acid, ethanesulfonic acid, benzenesulfonic acid, p-toluenesulfonic acid, trifluoromethanesulfonic acid, polystyrenesulfonic acid, acetic acid, citric acid, formic acid, gluconic acid, lactic acid, oxalic acid, tartaric acid, hydrofluoric acid, carbonic acid, or hydrogen sulfide may be used. In the example, the chemical that was used in the evaluation was an acid solution such as hydrochloric acid, nitric acid, etc.; and a solution that is used when performing chemical cleaning during maintenance of the members used inside the semiconductor manufacturing apparatus including the plasma-resistant member was selected.

For the comparative example for which the heating is not performed, as shown in FIG. 3, the average value of the proportion (M/C) of monoclinic to cubic inside the layer structural component is 70%; and the standard deviation of the distribution is 22%. Also, for the comparative example, the average crystallite size of the yttria polycrystalline body inside the layer structural component is 11 nm; and the standard deviation of the distribution of the crystallite size is 1.6 nm. Also, for the comparative example, the average lattice strain of the yttria polycrystalline body inside the layer structural component is 0.6%; and the standard deviation of the distribution of the lattice strain is 0.05%.

Thus, the fluctuation of the yttria polycrystal crystal structure is relatively large for the layer structural component for which the heating is not performed after being formed by aerosol deposition.

The crystal structure of the yttria polycrystalline body inside the layer structural component 123 changes according to the conditions of the heating. The range of the fluctuation of the crystal structure decreases as the temperature of the heating increases.

For example, as shown in FIG. 3, for the conditions of the heating of not less than 200° C. and not more than 600° C., the average value of the proportion of monoclinic to cubic inside the yttria polycrystalline body included in the layer structural component 123 is not less than 0.5% and not more than 60%; and the standard deviation of the distribution of the proportion of monoclinic to cubic is not less than about 0% and not more than about 15%.

Also, for the conditions of the heating of not less than 200° C. and not more than 600° C., the average crystallite size of the yttria polycrystalline body inside the layer structural component 123 is not less than 12 nm and not more than 40 nm; and the standard deviation of the distribution of the crystallite size is not less than 0.1 nm and not more than 1.1 nm. Also, in this case, the average lattice strain of the yttria polycrystalline body inside the layer structural component 123 is not less than 0.2% and not more than 0.5%; and the standard deviation of the distribution of the lattice strain is not less than 0.003% and not more than 0.04%.

Also, the inventor measured the spacing between mutually-adjacent crystallites inside the yttria polycrystalline body of the layer structural component 123. Here, the spacing between adjacent crystallites is the spacing between most proximal crystallites and does not include the voids defined by multiple crystallites.

The spacing between crystallites can be determined from an image obtained by an observation using TEM.

Figure 4:
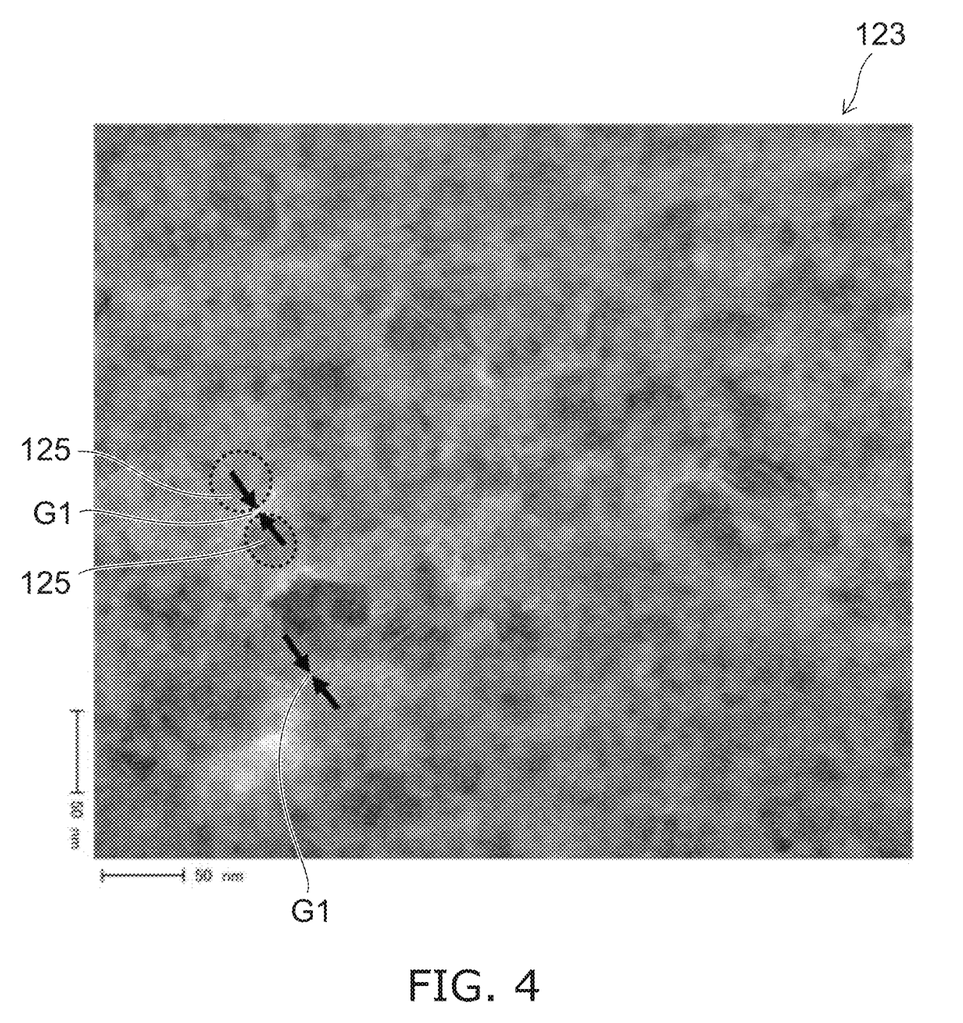
FIG. 4 is a photograph illustrating the layer structural component formed at the surface of the plasma-resistant member.

FIG. 4 is a photograph illustrating the layer structural component formed at the surface of the plasma-resistant member. In the example of FIG. 4, the yttria polycrystalline body described above for which the heating was performed at 200° C. was thinned using a focused-ion beam (FIB) method and observed. For the observation, a transmission electron microscope (H-9000NAR/made by Hitachi High-Technologies Corporation) was used; and the acceleration voltage was set to 300 kV. In the transmission electron microscope image, a spacing G1 between the crystallites 125 adjacent to each other inside the yttria polycrystalline body was not less than 0 nm but less than 10 nm. For example, the average value of the spacing G1 inside the observed image is not less than 0 nm but less than 10 nm.

The chemical resistance of the layer structural component 123 changes according to the crystal structure of the yttria polycrystalline body included in the layer structural component 123. For example, for the comparative example for which the heating is not performed, the fluctuation of the surface roughness after the chemical cleaning is "large." Conversely, for the conditions of the heating of 200° C. to 350° C., the fluctuation of the surface roughness after the chemical cleaning is "medium;" and the chemical resistance is high. Also, for the conditions of the heating of 400 to 600° C., the fluctuation of the surface roughness after the chemical cleaning is "small;" further, the chemical resistance is high.

Also, in the embodiment, by appropriately adjusting the conditions of the heating, the yttria polycrystalline body included in the layer structural component 123 may have not only a crystal structure in which cubic and monoclinic coexist but also a crystal structure including only cubic. In other words, in the embodiment, the average value of the proportion of monoclinic to cubic may be 0%; and the standard deviation of the distribution of the proportion may be 0%. Even in such a case, a high chemical resistance is obtained.

Thus, it is favorable for the average value of the proportion of monoclinic to cubic inside the yttria polycrystalline body included in the layer structural component 123 to be not less than 0% and not more than 60%; and it is more favorable to be not less than 0% and not more than 25%. It is favorable for the standard deviation of the distribution of the proportion of monoclinic to cubic to be not less than 0% and not more than 15%; and it is more favorable to be not less than 0% and not more than 6%. Thus, the fluctuation of the crystal structure of the yttria polycrystalline body can be suppressed; the chemical resistance can be improved by causing the crystal structure to be dense; and the chamber conditions can be maintained stably.

In the layer structural component 123, it is favorable for the average lattice strain of the yttria polycrystalline body to be not less than 0.2% and not more than 0.5%; and it is favorable for the standard deviation of the distribution of the lattice strain of the yttria polycrystalline body to be not less than 0.003% and not more than 0.04%. Due to the crystal structure in which the lattice strain and the fluctuation of the lattice strain are small, the occurrence of particles can be suppressed further.

Also, even in the case where the heating of 200° C. to 600° C. is performed, the average crystallite size of the yttria polycrystal is not less than 12 nm and not more than 40 nm and is extremely small. In this case, the standard deviation of the distribution of the crystallite size also is not less than 0.1 nm and not more than 1.1 nm and is extremely small. Also, the spacing between mutually-adjacent crystallites is less than 10 nm, and favorably 5 nm or less. Thus, because the yttria polycrystalline body has an extremely dense structure, the chemical resistance can be maintained; and the particles can be reduced.

Also, as shown in FIG. 3, it can be seen that the chemical resistance is high when the ratio (O/Y) of the atomic concentration of oxygen to the atomic concentration of yttrium is not less than 1.3 and not more than 1.8.

For the comparative example for which the heating is not performed, the atomic concentration ratio (O/Y) is 1.9 to 2.2. Conversely, the atomic concentration decreases due to the heating. It is considered that this is because, for example, dehydration synthesis by an OH group occurs due to the heating. Thereby, the yttria grains are bonded more securely; a denser structure is obtained; and the chemical resistance improves.

The measurement and the calculation of each value shown in FIG. 3 will now be described.

X-ray analysis (X-ray Diffraction: XRD) was used to measure the crystallite size, the proportion of monoclinic to cubic, and the lattice strain.

The Scherrer equation recited below was used to calculate the crystallite size.

$$D = K\lambda / (\beta \cos \theta)$$

Here, D is the crystallite size; $\beta$ is the peak width at half maximum (radians (rad)); $\theta$ is the Bragg angle (rad); and $\lambda$ is the wavelength of the X-ray used in the measurement.

In the Scherrer equation, $\beta$ is calculated by $\beta = (\beta_{obs} - \lambda_{std})$. $\beta_{obs}$ is the width at half maximum of the X-ray analysis peak of the measurement sample; and $\beta_{std}$ is the width at half maximum of the X-ray analysis peak of the standard sample. 0.94 was used as the value of K.

The crystallite size may be calculated from the image of TEM observation, etc. For example, the average value of the equivalent circular diameter of the crystallite can be used as the crystallite size.

The maximum peak intensity caused by the cubic crystals at the $2\theta = 29°$ vicinity and the maximum peak intensity caused by the monoclinic crystals at the $2\theta = 30°$ vicinity were used to calculate the proportion of monoclinic to cubic. The proportion of monoclinic to cubic may not be calculated using the peak intensity ratios, and may be calculated using the peak area ratios. In other words, the proportion of monoclinic to cubic is calculated by the peak intensity (M) of monoclinic/peak intensity (C) of cubic×100 (%) or by the peak surface area (M) of monoclinic/peak surface area (C) of cubic×100 (%).

The Wilson equation recited below using the peak at the $2\theta = 48°$ vicinity was used to calculate the lattice strain.

$$d = \beta / (4 \tan \theta)$$

Here, d is the lattice strain. $\beta$ is the peak width at half maximum (rad); and $\theta$ is the Bragg angle (rad). In the Wilson equation, $\beta$ is calculated by $\beta = (\beta_{obs}^2 - \beta_{std}^2)^{1/2}$. $\beta_{obs}$ is the width at half maximum of the X-ray analysis peak of the measurement sample; and $\beta_{std}$ is the width at half maximum of the X-ray analysis peak of the standard sample.

"X'pert PRO/made by PANalytical B.V." was used as the XRD apparatus. A tube voltage of 45 kV, a tube current of 40 mA, and a scan step of 0.017° were used. The size of the sample used in the XRD can be about 20 mm×about 20 mm; and the measurement area can be about 5 mm×about 15 mm.

The ratio (O/Y) of the atomic concentration of oxygen to the atomic concentration of yttrium is determined by quantitative analysis using energy dispersive X-ray spectroscopy (Energy Dispersive X-ray Spectroscopy: EDX). For example, the atomic concentration ratio (O/Y) can be calculated by performing semi-quantitative analysis of the oxygen and the yttrium using SEM-EDX (SEM: S-3000N/made by Hitachi High-Technologies Corporation and EDX: EMAX ENERGY/made by Horiba, Ltd.). An acceleration voltage: 15 kV, an X-ray take-off angle: 35 degrees (sample tilt angle: 0 degrees), a working distance (W.D): 15 mm, a magnification: 200 times, and an analysis area: 500 μm×680 μm can be used as the analysis conditions.

Multiple measurement points (multiple samples) were prepared for each of the conditions of the heating; and the proportion of monoclinic to cubic, the crystallite size, the lattice strain, and the ratio (O/Y) of the atomic concentration of oxygen to the atomic concentration of yttrium were measured by the methods described above for each of the measurement points. For each of the conditions of the heat treatment, the average value (the arithmetic mean) and the standard deviation of the multiple measurement points were calculated for the proportion of monoclinic to cubic, the crystallite size, and the lattice strain.

The standard deviation can be calculated by the following formula.

[Formula 1]

$$s = \sqrt{\frac{\sum_{i=1}^{n}(Xi - Xa)^2}{n-1}} \quad \text{Formula (1)}$$

s is the standard deviation; n is the number of the measurement points; Xi is the measured value (the proportion of monoclinic to cubic, the crystallite size, or the lattice strain) at each measurement point; and Xa is the average value of the multiple measurement points. The number of the measurement points used to calculate each value (the average value or the standard deviation) is 3 or more. The multiple measurement points of each of the conditions of the heat treatment may be selected from one plasma-resistant member or may be selected from different plasma-resistant members formed using the same conditions.

The inventor determined that the surface state of the layer structural component 123 formed at the surface of the plasma-resistant member 120 can be evaluated by an expression including the entire surface of the layer structural component 123 using an arithmetic average Sa, a core material volume Vmc, a core void volume Vvc, a developed interfacial area ratio Sdr, and a root mean square slope SΔq. Then, the arithmetic average Sa was used to evaluate the fluctuation of the surface roughness of the layer structural component 123 formed at the surface of the plasma-resistant member 120 after the chemical cleaning. Instead of the arithmetic average Sa, an arithmetic average roughness Ra may be used to evaluate the fluctuation of the surface roughness of the layer structural component. For example, the arithmetic average roughness Ra can be measured using a stylus-type surface roughness meter.

Figure 5A:
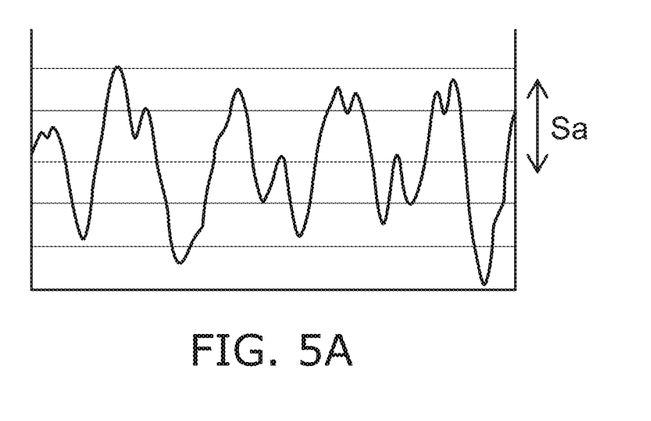
FIGS. 5A to 5C are schematic views describing three-dimensional surface texture parameters.
Figure 5B:
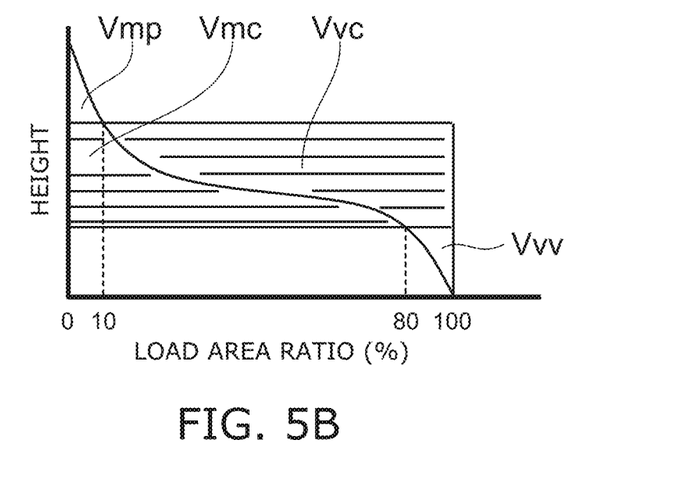
Figure 5C:
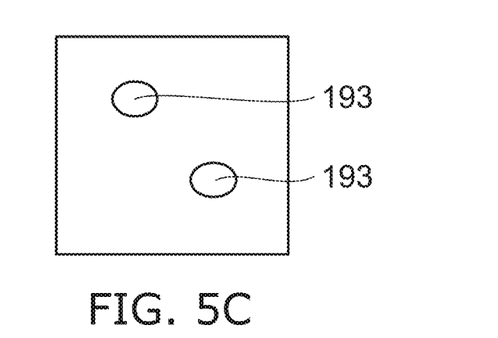

FIGS. 5A to 5C are schematic views describing three-dimensional surface texture parameters. FIG. 5A is a graph describing the average swing (the arithmetic average) Sa in the height direction. FIG. 5B is a graph describing the core material volume Vmc and the core void volume Vvc. FIG. 5C is a schematic plan view describing the protrusion (or hole) density inside the defined segmentation.

The inventor verified the surface state of the layer structural component using a laser microscope. "OLS4000/made by Olympus" was used as the laser microscope. The magnification of the objective lens is 100 times. The zoom is 5 times. The cut-off was set to be 2.5 μm or 0.8 μm.

The average swing (the arithmetic average) Sa in the height direction is the two-dimensional arithmetic average roughness Ra extended three-dimensionally and is a three-dimensional roughness parameter (a three-dimensional height direction parameter). Specifically, the arithmetic average Sa is the volume of the portion surrounded with the surface configuration curved surface and the mean plane divided by the measured surface area. The arithmetic average Sa is defined by the following formula, where the mean plane is the xy plane, the vertical direction is the z-axis, and the measured surface configuration curve is z(x, y). Here, "A" in Formula (2) is the measured surface area.

[Formula 2]

$$Sa = \frac{1}{A}\int\int_A |z(x,y)|dxdy \quad \text{Formula (2)}$$

The parameters relating to the core material volume Vmc and the core void volume Vvc determined from the load curve are defined as in the graph illustrated in FIG. 5B and are three-dimensional volume parameters. In other words, the height when the load area ratio is 10% is the boundary between a peak material volume Vmp, the core material volume Vmc, and the core void volume Vvc. The height when the load area ratio is 80% is the boundary between a valley void volume Vvv, the core material volume Vmc, and the core void volume Vvc. The peak material volume Vmp, the core material volume Vmc, the core void volume Vvc, and the valley void volume Vvv represent the volume (units: $m^3/m^2$) per unit surface area.

The developed interfacial area ratio Sdr is a parameter of the rate of increase of the interface with respect to the sampling plane. The developed interfacial area ratio Sdr is the value of the sum total of the small developed areas of the interface formed by four points divided by the measured surface area and is defined by the following formula. Here, "A" in Formula (3) represents the surface area of the defined segmentation.

[Formula 3]

$$Sdr = \frac{1}{A}\left[\int\int_A \sqrt{\left[1+\left(\frac{\partial Z(xy)}{\partial x}\right)^2 + \left(\frac{\partial Z(xy)}{\partial y}\right)^2 + \right]} - 1 dxdy\right] \quad \text{Formula (3)}$$

The root mean square slope SΔq represents a two-dimensional mean square slope angle Δq at the sampling plane. The surface slope is represented by the following formula at any point.

[Formula 4]

$$\rho_{ij} = \left[\left(\frac{\partial Z(x,y)}{\partial x}\right)^2 + \left(\frac{\partial Z(x,y)}{\partial y}\right)^2 +\right]^{1/2}\bigg|_{x=x_i, y=y_j}$$

$$\approx \left[\left(\frac{Z(x_i, y_j) - Z(x_{i-1}, y_j)}{\Delta x}\right)^2 + \left(\frac{Z(x_i, y_j) - Z(x_i, y_{j-1})}{\Delta y}\right)^2\right]^{1/2}$$

Formula (4)

Therefore, the root mean square slope SΔq is represented by the following formula.

[Formula 5]

$$S_{\Delta q} = \sqrt{\frac{1}{(M-1)(N-1)}\sum_{j=2}^{N}\sum_{i=2}^{M}\rho_{ij}^2}$$

$$\approx \sqrt{\frac{1}{(M-1)(N-1)}\sum_{j=2}^{N}\sum_{i=2}^{M}\left[\left(\frac{Z(x_i, y_j) - Z(x_{i-1}, y_j)}{\Delta x}\right)^2 + \left(\frac{Z(x_i, y_j) - Z(x_i, y_{j-1})}{\Delta y}\right)^2\right]}$$

Formula (5)

The embodiments of the invention have been described above. However, the invention is not limited to the above description. Those skilled in the art can appropriately modify the above embodiments, and such modifications are also encompassed within the scope of the invention as long as they include the features of the invention. For instance, the shape, dimension, material, arrangement and the like of various components in the semiconductor manufacturing apparatus 100 and the like, and the installation configuration and the like of the plasma-resistant member 120 and the electrostatic chuck are not limited to those illustrated, but can be modified appropriately.

Furthermore, various components in the above embodiments can be combined with each other as long as technically feasible. Such combinations are also encompassed within the scope of the invention as long as they include the features of the invention.

According to embodiments of the invention, a plasma-resistant member is provided in which the particles can be reduced and the chamber conditions can be maintained stably.

What is claimed is:

1. A plasma-resistant member, comprising:
   a base material; and
   a layer structural component including an yttria polycrystalline body, being formed at a surface of the base material,
   the yttria polycrystalline body included in the layer structural component having a crystal structure including only cubic, or a crystal structure in which cubic and monoclinic coexist,
   a proportion of monoclinic to cubic inside the yttria polycrystalline body included in the layer structural component being greater than 0% and not more than 25%,
   wherein an average crystallite size of the yttria polycrystalline body included in the layer structural component is not less than 12 nanometers and not more than 40 nanometers.

2. The plasma-resistant member according to claim 1, wherein a standard deviation of a distribution of the proportion of monoclinic to cubic in the yttria polycrystalline body included in the layer structural component is not less than 0% and not more than 15%.

3. A plasma-resistant member, comprising:
   a base material; and
   a layer structural component including an yttria polycrystalline body, being formed at a surface of the base material,
   the yttria polycrystalline body included in the layer structural component having a crystal structure including only cubic, or a crystal structure in which cubic and monoclinic coexist,
   a proportion of monoclinic to cubic inside the yttria polycrystalline body included in the layer structural component being greater than 0% and not more than 25%,
   an average crystallite size of the yttria polycrystalline body included in the layer structural component being not less than 12 nanometers and not more than 40 nanometers,
   a standard deviation of a distribution of a crystallite size of the yttria polycrystalline body included in the layer structural component being not less than 0.1 nanometers and not more than 1.1 nanometers.

4. The plasma-resistant member according to claim 3, wherein an average lattice strain of the yttria polycrystalline body included in the layer structural component is not less than 0.2% and not more than 0.5%.

5. The plasma-resistant member according to claim 4, wherein a standard deviation of a distribution of the lattice strain of the yttria polycrystalline body included in the layer structural component is not less than 0.003% and not more than 0.04%.

6. The plasma-resistant member according to claim 1, wherein a ratio (O/Y) of an atomic concentration of oxygen (O) to an atomic concentration of yttrium (Y) inside the yttria polycrystalline body included in the layer structural component is not less than 1.3 and not more than 1.8.

7. A plasma-resistant member, comprising:
   a base material; and
   a layer structural component including an yttria polycrystalline body, being formed at a surface of the base material,
   the yttria polycrystalline body included in the layer structural component having a crystal structure including only cubic, or a crystal structure in which cubic and monoclinic coexist,
   a proportion of monoclinic to cubic inside the yttria polycrystalline body included in the layer structural component being greater than 0% not more than 25%,
   an average lattice strain of the yttria polycrystalline body included in the layer structural component being not less than 0.2% and not more than 0.5%.

8. The plasma-resistant member according to claim 7, wherein a standard deviation of a distribution of the lattice strain of the yttria polycrystalline body included in the layer structural component is not less than 0.003% and not more than 0.04%.

9. The plasma-resistant member according to claim 1, wherein the proportion of monoclinic to cubic inside the yttria polycrystalline body included in the layer structural component is greater than 2% and not more than 17%.

* * * * *